United States Patent
Joffe

(10) Patent No.: US 10,491,169 B1
(45) Date of Patent: Nov. 26, 2019

(54) SYSTEMS AND METHODS FOR ERROR CORRECTION IN A COMMUNICATION DEVICE

(71) Applicant: ADTRAN, INC., Huntsville, AL (US)

(72) Inventor: Daniel M. Joffe, Owens Crossroads, AL (US)

(73) Assignee: ADTRAN, Inc., Huntsville, AL (US)

(*) Notice: Subject to any disclaimer, the term of this patent is extended or adjusted under 35 U.S.C. 154(b) by 0 days.

(21) Appl. No.: 15/582,691

(22) Filed: Apr. 30, 2017

(51) Int. Cl.
H03F 1/32 (2006.01)
H03F 3/45 (2006.01)
H04B 1/40 (2015.01)

(52) U.S. Cl.
CPC ........ H03F 1/3211 (2013.01); H03F 3/45475 (2013.01); H04B 1/40 (2013.01)

(58) Field of Classification Search
CPC ...... H03F 1/3211; H03F 3/45475; H04B 1/40
USPC ............................ 375/219; 327/541; 323/282
See application file for complete search history.

(56) References Cited

U.S. PATENT DOCUMENTS

| 4,523,152 A | 6/1985 | Garde |
| 6,259,320 B1 | 7/2001 | Valk et al. |
| 6,600,369 B2 | 7/2003 | Mitzlaff |
| 9,564,990 B1 | 2/2017 | Tiruvur et al. |
| 2004/0169550 A1* | 9/2004 | Perrier ................... G05F 1/575 327/541 |
| 2013/0009621 A1* | 1/2013 | Chen ....................... G05F 1/561 323/282 |
| 2013/0272314 A1 | 10/2013 | Kuipers et al. |

OTHER PUBLICATIONS

Vanderkooy, et al, "Feedforward Error Correction in Power Amplifies," Journal of the Audio Engineering Society, vol. 28, No. 1, 1980.

* cited by examiner

Primary Examiner — Chieh M Fan
Assistant Examiner — Fitwi Y Hailegiorgis
(74) Attorney, Agent, or Firm — Maynard Cooper & Gale, P.C.; Jon E. Holland

(57) ABSTRACT

A driver circuit for a transmitter includes a main path in parallel with an error correction path used for feed-forward error correction. The main path has an amplifier for amplifying a data signal to be transmitted from the transceiver. In parallel with the amplifier is a feedforward error correction circuit that provides an error correction signal that compensates for distortion introduced by the amplifier when the error correction signal is combined with the amplifier's output. The error correction circuit is designed to have a high impedance output so that voltage swings in the data signal do not create a demand for significant current from the feedforward error correction circuit, thereby reducing the current of the error correction signal. As an example, it is possible for the current of the error correction signal to substantially match that which is required to cancel the amplifier distortion, thereby minimizing distortion of the signal.

20 Claims, 4 Drawing Sheets

SYSTEMS AND METHODS FOR ERROR CORRECTION IN A COMMUNICATION DEVICE

BACKGROUND

The present application generally relates to systems and methods for providing feed-forward error correction in a driver circuit of a communication device.

Network service providers want to satisfy customer demand for high-speed data. One way to provide customers with high speed data is through the re-use of one or more existing metallic, e.g., copper, drop wires to the customer. However, in order to transmit increasingly higher speed data over metallic drop wires, the bandwidth and linearity of the driver circuit in the transmitting transceiver has to be correspondingly increased.

Unfortunately, however, the amplifier in the transmitting transceiver introduces significant distortion into the data signal making it difficult to achieve high linearity, particularly for greater bandwidths. Attempts have been made to compensate for the distortion introduced by the amplifier by using a feedback circuit to apply negative feedback. However, negative feedback creates trade-offs between linearity and bandwidth and between linearity and gain. That is, when negative feedback is used to compensate for amplifier distortion, linearity limits the extent to which bandwidth and gain can be increased.

To address some of the limitations of using negative feedback to compensate for distortion, a feed-forward error correction circuit can be used. However, there are challenges to using a feed-forward error correction circuit to compensate for amplifier distortion. Specifically, conventional circuits that combine correction outputs with the main outputs reduce the gain of the main path. Further, conventional feed-forward error correction circuits typically source a significant amount of current in order to achieve high linearity, resulting in increased demand on both the main path and the correction path. In fact, many conventional feed-forward error correction circuits reduce the gain of the amplifier by up to about 50%. As a result, adoption of feed-forward error correction circuits to compensate for amplifier distortion has been limited.

SUMMARY

The present application generally pertains to a feed-forward error correction topology in a driver circuit that uses a voltage-controlled current source output in the error-correcting amplifier of the driver circuit.

One advantage of the present application is a reduction in output current being provided by the error correcting amplifier of the driver circuit thereby maximizing the linearity and potential bandwidth of the error correcting amplifier.

Another advantage of the present application is increased linearity of the amplifier in the main path of the driver circuit.

Still another advantage of the present application is no loss of gain in the amplifier in the main path of the driver circuit.

Other features and advantages of the present application will be apparent from the following more detailed description of the identified embodiments, taken in conjunction with the accompanying drawings which show, by way of example, the principles of the application.

BRIEF DESCRIPTION OF THE DRAWINGS

Wherever possible, the same reference numbers are used throughout the drawings to refer to the same or like parts.

DETAILED DESCRIPTION

The present application generally pertains to a driver circuit in a transmitter that communicates high speed data signals over a subscriber line (e.g., a drop connection). The driver circuit includes a main path in parallel with an error correction path used for feed-forward error correction. The main path has an amplifier for amplifying a data signal to be transmitted from the transmitter. In parallel with the amplifier is a feed-forward error correction circuit that provides an error correction signal to compensate for distortion introduced by the amplifier. The correction and resultant distortion reduction occur when the error correction signal is combined with the main amplifier's output. The error correction circuit is designed to have a high impedance output so that voltage swings in the data signal do not create a demand for significant current from the feed-forward error correction circuit, thereby reducing the current of the error correction signal. As an example, it is possible for the current of the error correction signal to substantially match only that output current which is required to cancel the amplifier distortion, thereby minimizing distortion of the signal.

Figure 1:
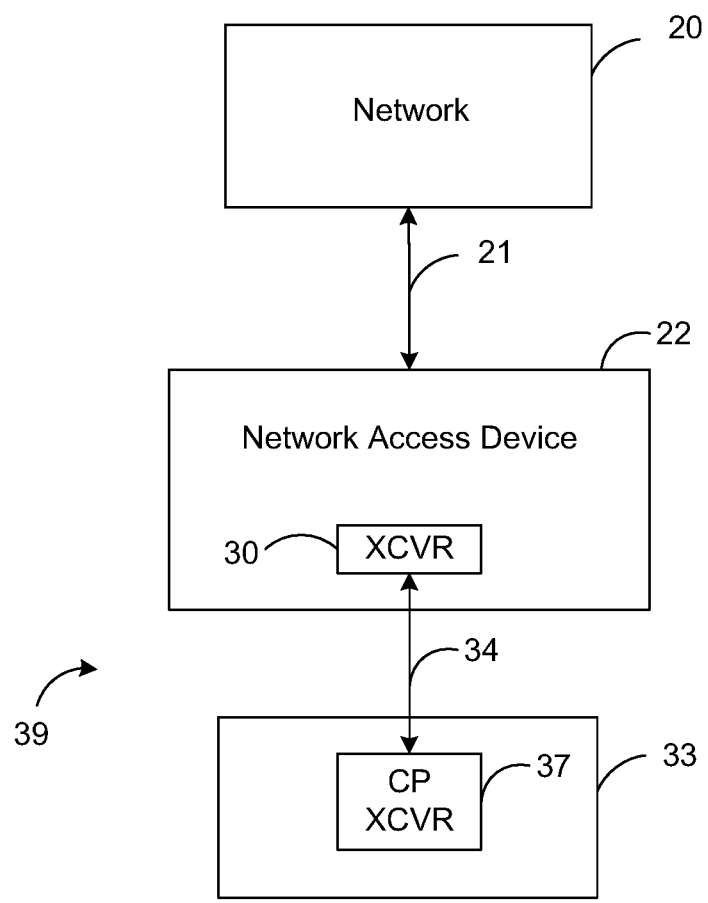
FIG. 1 is a block diagram showing an embodiment of a communication system.

FIG. 1 depicts an embodiment of a telecommunication system 39 for communicating data between customer premises equipment (CPE) and a telecommunication network 20. Examples of networks and telecommunication systems that can be used with the present application are described in commonly-assigned U.S. Patent Application Publication No. 2013/0272314, entitled "Systems and Methods for Avoiding Crosstalk" and published on Oct. 17, 2013, which is incorporated herein by reference.

As shown by FIG. 1, the system 39 includes a telecommunication network 20, such as the public switched telephone network (PSTN), connected to a network access device (NAD) 22 via a connection 21. The NAD 22 can include a transceiver (XCVR) 30 for transmitting data received from the telecommunication network 20 to at least one customer premises (CP) 33. In the embodiment shown by FIG. 1, the XCVR 30 is coupled to at least one CP XCVR 37 or other communication device via a subscriber line 34 (e.g., a drop connection). The subscriber line 34 may include a twisted wire pair, but other types of subscriber lines are possible in other embodiments. While the NAD 22 in FIG. 1 only shows one XCVR 30, the NAD 22 can include additional XCVRs 30 connected to other CP XCVRs 37 in other embodiments. The NAD 22 also may include other components (in addition to XCVR 30), as is described by U.S. Patent Application Publication No. 2013/0272314, that can be used to facilitate communications, both upstream and downstream, between the CP 33 and the telecommunication network 20. In one embodiment, the NAD 22 may reside at a central office of a telecommunication network or an intermediate point between a central office and the CP 33.

Figure 2:
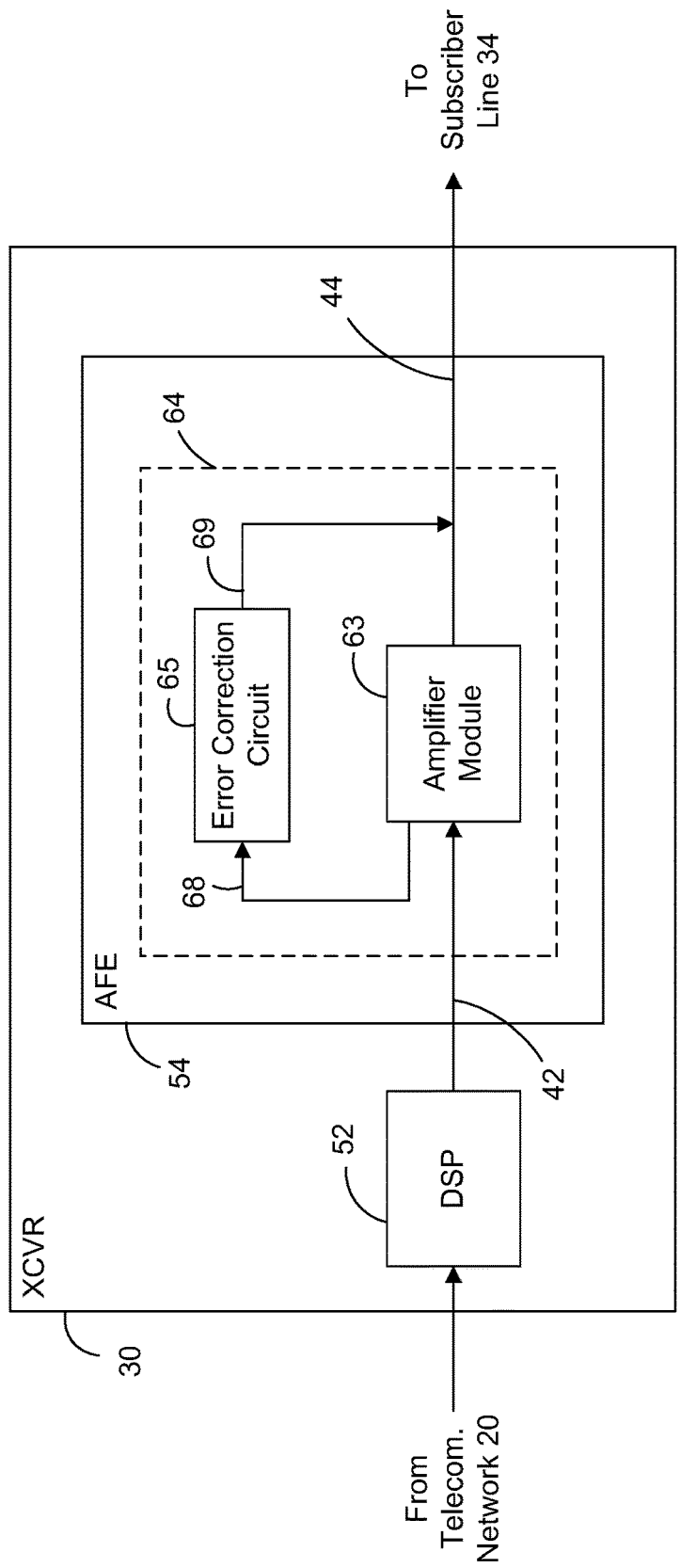
FIG. 2 is a block diagram showing an embodiment of a transceiver with a driver circuit.

FIG. 2 shows an embodiment of an XCVR 30 used for providing downstream communications to the CP XCVR 37.

It is to be understood that the XCVR 30 shown in FIG. 2 may include additional equipment and/or components to perform additional functions and operations that are not shown in FIG. 2, e.g., the processing of upstream communications. The XCVR 30 has a digital signal processor (DSP) 52 that receives and processes data from the telecommunication network 20. The DSP 52 provides a data signal to an analog front end (AFE) module 54 that transmits the data signal across the subscriber line 34 to the CP XCVR 37. The AFE module 54 has a driver circuit 64 to amplify the data signal from the DSP 52 and transmit the amplified signal to the CP XCVR 37. Note that in one embodiment all of the components of the XCVR 30 can reside on a printed circuit board (PCB), which may be referred to as a "line card." In other embodiments, other configurations of the XCVR 30 are possible.

The driver circuit 64 includes an amplifier module 63 connected in parallel to an error correction circuit 65. The error correction circuit 65 provides a feed-forward error correction signal to the output of the amplifier module 63 to cancel the distortion introduced into the amplified signal by the amplifier module 63. In one embodiment, the error correction circuit 65 can provide a gain to the error correction signal that matches the gain to the data signal provided by the amplifier module.

The driver circuit 64 has a main path with an input connection 42 that propagates the data signal from the DSP 52 and an output connection 44 connected to the subscriber line 34. The input connection 42 propagates the data signal from the DSP 52 to the amplifier module 63, and the output connection 44 propagates the amplified output signal from the amplifier module 63 to the subscriber line 34. The driver circuit 64 also has an error correction path that includes the error correction circuit 65. The error correction path has an input connection 68 that propagates an error signal from the amplifier module 63 as an input for the error correction circuit 65. In one embodiment, the input connection 68 is coupled the inverting terminal of the amplifier 96 (see FIG. 5) of the amplifier module 63, and the error signal carried by the input connection 68 corresponds to the amount of distortion in the amplified output signal from the amplifier 96. The error correction path also has an output connection 69 that propagates the feed-forward error correction signal output from the error correction circuit 65. The output connection 69 is connected to the output connection 44 of the main path. The output of the error correction circuit 65, referred to hereafter as the "error correction signal," corresponds to a voltage substantially equal in magnitude to that of the distortion introduced by the amplifier module 63 with an opposite polarity so that the error correction signal substantially cancels such distortion when combined with the output of the amplifier module 63 on output connection 44.

Figure 3:
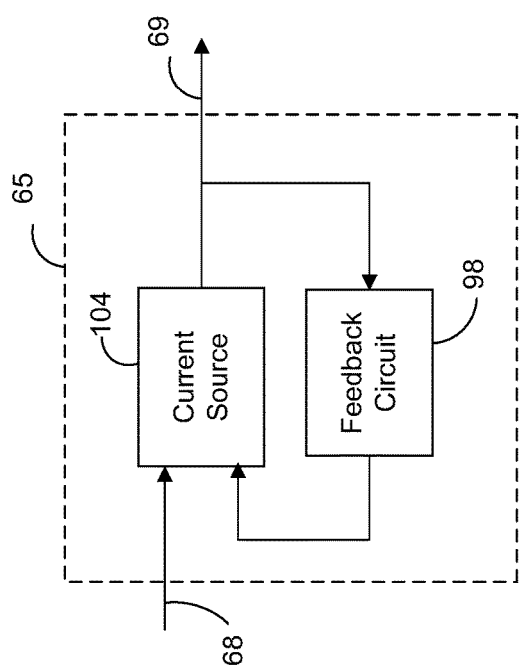
FIG. 3 is a block diagram showing an embodiment of an error correction circuit, such as is depicted by FIG. 2.

FIG. 3 shows an embodiment of the error correction circuit 65. The error correction circuit 65 includes a current source 104 connected in parallel to a feedback circuit 98. The current source 104 receives the error signal, which is related to the voltage (Vn) (see FIG. 5) input to the amplifier 96 (see FIG. 5) and is representative of the distortion in the output signal from the amplifier 96, from input connection 68 and provides an error correction current, i.e., the error correction signal, to output connection 69 and the output connection 44 of the main path to cancel the distortion in the output signal from the amplifier module 63. The feedback circuit 98 is connected to the output connection 69 of the error correction circuit 65 and provides a positive feedback signal to the current source 104.

In one embodiment, since the error correction current provided by the error correction circuit 65 is based on the error signal received by the error correction circuit 65, which also corresponds to the input voltage to the amplifier 96 of the amplifier module 63, the error correction circuit 65 can provide the appropriate error correction current in response to changes in the error signal, which corresponds to the input voltage to the amplifier 96. For example, the error signal may vary as a result of changes in the gain of amplifier 96 caused by changes in the data signal received at the input connection 42.

Figure 4:
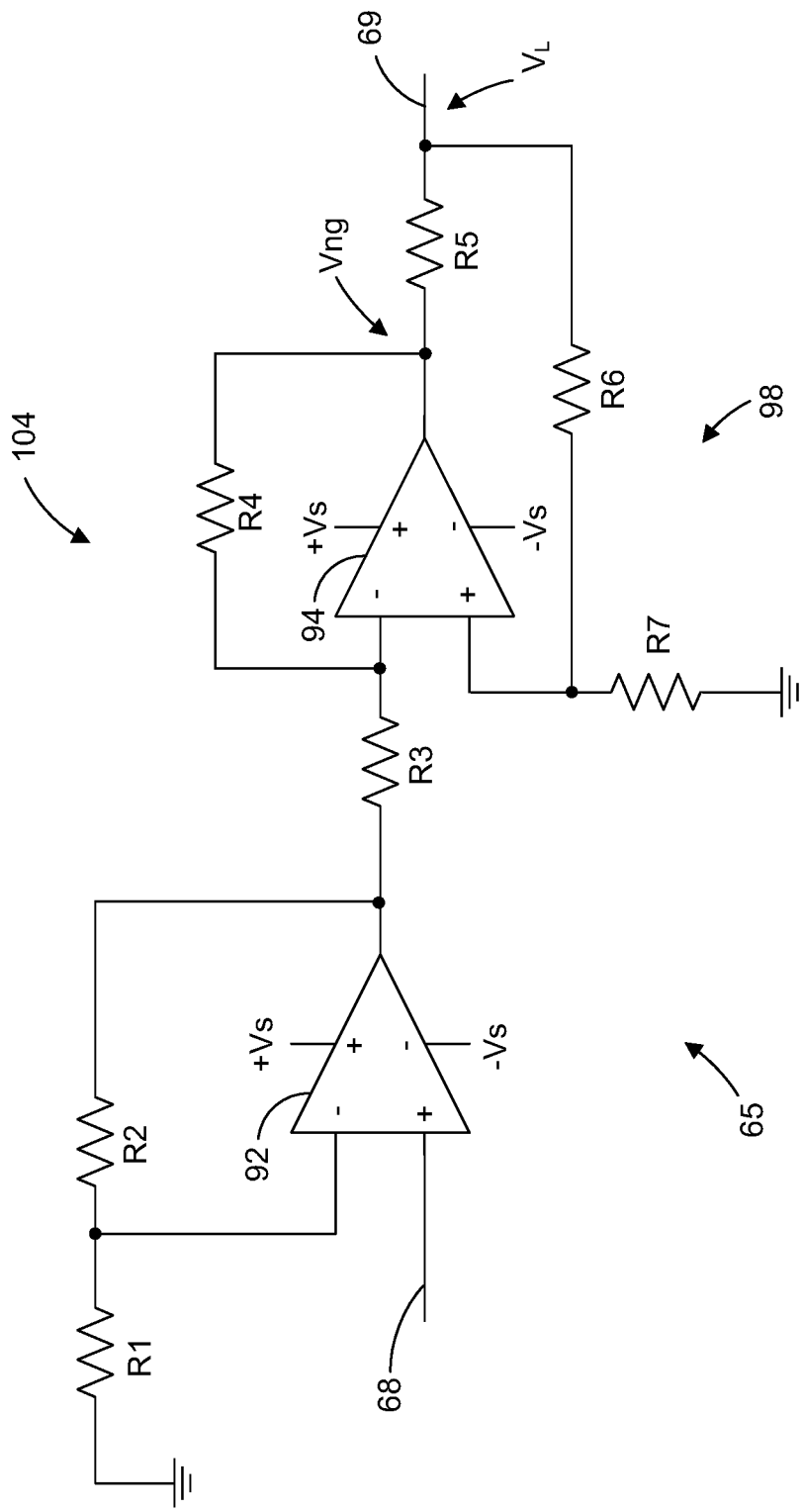
FIG. 4 is a circuit diagram showing an embodiment of the error correction circuit of FIG. 3.

FIG. 4 shows a circuit diagram of an embodiment of the error correction circuit 65. The current source 104 can include a first operational amplifier (op-amp) 92 connected in series with a second op-amp 94. In one embodiment, the first op-amp 92 can be used to receive the error signal from the amplifier module 63 and provide an amplified output signal to the second op-amp 94 for subsequent processing by the second op-amp 94. The second op-amp 94 can operate as a voltage controlled current source to provide an error correction current to the output of the amplifier module 63 to cancel the distortion in the output signal from the amplifier module 63. The error correction current from the second op-amp 94 is related to the error signal input to the first op-amp 92. The first op-amp 92 and the second op-amp 94 can each be powered by a supply voltage (Vs) in one embodiment. The first op-amp 92 can receive an error voltage based on the error signal from input connection 68 at the non-inverting input of the first op-amp 92 and amplify the error voltage at the output of the first op-amp 92. The inverting input of the first op-amp 92 is connected to a voltage divider using resistors R1 and R2 and receives a negative feedback signal from the output of the first op-amp 92. In one embodiment, resistors R1 and R2 can have the same resistance.

The amplified error voltage output of the first op-amp 92 is connected in series with a resistor R3 that is then connected in series with the inverting input of the second op-amp 94. The inverting input of the second op-amp 94 also receives a negative feedback signal from the output of the second op-amp 94 through resistor R4. In one embodiment, resistors R3 and R4 can have the same resistance. In another embodiment, resistors R1, R2, R3 and R4 can all have the same resistance. The output of the second op-amp 94 is connected to output connection 69 through resistor R5. The non-inverting input of the second op-amp 94 receives a positive feedback signal from the feedback circuit 98 connected to the output connection 69. The use of the feedback circuit 98 with the second op-amp 94 operates to provide a high output impedance for the second op-amp 94 such that the output of the second op-amp 94, i.e., the error correction current, is independent of any voltage changes in the main path resulting from changes in the voltage associated with the data signal received at input connection 42. The feedback circuit 98 can include a voltage divider using resistors R6 and R7 to provide the positive feedback signal to the non-inverting input of the second op-amp 94. In one embodiment, the second op-amp 94 and resistors R3, R4, R5, R6 and R7 can be configured as a Howland current source. In another embodiment, R6 can have a resistance equal to the resistance of R7. In still another embodiment, resistors R1, R2, R3, R4, R6 and R7 can all have the same resistance.

When resistors R6 and R7 have the same resistance, the feedback circuit 98 can be used to provide half (½) of the voltage at the output connection 69 ($V_L$) to the non-inverting input of the second op-amp 94. The inverting input of the second op-amp 94 can receive a gain of 2 when resistors R3 and R4 have the same resistance. In the embodiment where the second op-amp 94 receives a gain of two at the inverting input and ½ of $V_L$ at the non-inverting input, the output voltage of the second op-amp 94 (Vng) can be equal to $V_L$ and no current will flow through resistor R5 due to the voltage $V_L$ since Vng is equal to $V_L$.

The use of the feedback circuit 98 with the second op-amp 94 results in the second op-amp 94 having a high output impedance to prevent the second op-amp 94 from having to deliver current in response to $V_L$. In one embodiment, the second op-amp 94 only provides current to the output connection 69 based on the output signal provided by the first op-amp 92, which output signal is based on the error signal from the amplifier module 63. In other words, the current source 104 is a voltage controlled current source that outputs an error correction current based on the voltage associated with the error signal input to the current source 104.

Figure 5:
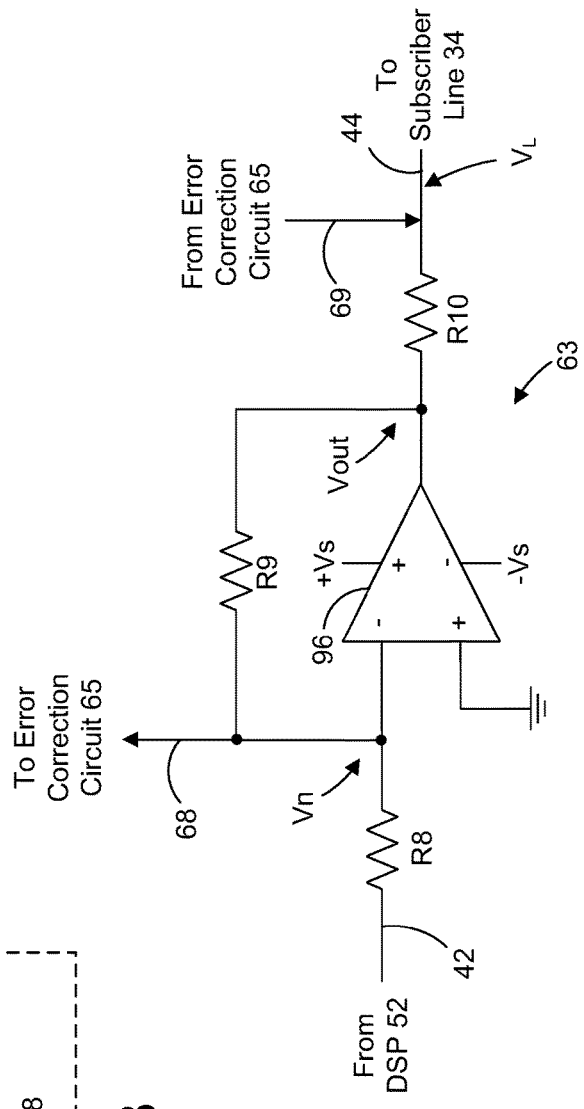
FIG. 5 is a circuit diagram showing an embodiment of an amplifier module, such as is depicted by FIG. 2.

FIG. 5 shows a circuit diagram of an embodiment of the amplifier module 63. The amplifier module 63 includes a third op-amp 96. The third op-amp 96 can be powered by a supply voltage (Vs) in one embodiment. The inverting input of the third op-amp 96 can be connected in series with the input connection 42 through resistor R8 to receive the data signal from the telecommunication network. The inverting input of the third op-amp 96 also receives a negative feedback signal based on the output voltage of the third op-amp 96 (Vout) through resistor R9. In one embodiment, the voltage Vn at the inverting input of the third op-amp 96 can be equivalent to the data signal at the input connection 42. In another embodiment, resistors R8 and R9 can have the same resistance. In a further embodiment, R1, R2, R3, R4, R6, R7, R8 and R9 can all have the same resistance. The output of the third op-amp 96 is connected to output connection 44 through resistor R10. The error correction current from the output connection 69 of the error correction circuit 65 can pass through R10 to form an opposite voltage to cancel the error voltage (Vn) in the data signal provided at the input connection 42. In other words, the error correction current from the error correction circuit 65 adds a slight negative component to Vout that counteracts the error signal resulting from the finite gain of the third op-amp 96.

In one embodiment, the ratio of R9/R8 from the amplifier module 63 can be equal to the ratio of R2/R1 from the error correction circuit 65 to maintain the balance of the main path and the error correction path and to enable different gains in the third op-amp 96. In another embodiment, the third op-amp 96 can be configured to provide a gain of −1 when R8 and R9 have the same resistance.

The driver circuit 64 is described in various embodiments for use within a transceiver 30 of a network access device 22. However, it is possible to use the driver circuit 64 in other types of communication devices, such as the CP XCVR 37 located at the customer premises 33. As an example, a CP XCVR 37 may be configured similar to the block diagram shown by FIG. 2 having a driver circuit 64 that is coupled between CP equipment connected to the CP XCVR 37 and the subscriber line 34.

Although the figures herein may show a specific order of method steps, the order of the steps may differ from what is depicted. Also, two or more steps may be performed concurrently or with partial concurrence. Variations in step performance can depend on the software and hardware systems chosen and on designer choice. All such variations are within the scope of the application. Software implementations could be accomplished with standard programming techniques, with rule based logic and other logic to accomplish the various connection steps, processing steps, comparison steps and decision steps.

It should be understood that the identified embodiments are offered by way of example only. Other substitutions, modifications, changes and omissions may be made in the design, operating conditions and arrangement of the embodiments without departing from the scope of the present application. Accordingly, the present application is not limited to a particular embodiment, but extends to various modifications that nevertheless fall within the scope of the application. It should also be understood that the phraseology and terminology employed herein is for the purpose of description only and should not be regarded as limiting.

What is claimed is:

1. A driver circuit for a communication device comprising:
    an amplifier circuit comprising a first input connection and a first output connection;
    an error correction circuit connected in parallel to the amplifier circuit, the error correction circuit comprising a second input connection connected to the amplifier circuit to propagate an error signal from the amplifier circuit and a second output connection connected to the first output connection of the amplifier circuit, wherein the error signal corresponds to an amount of distortion in an output signal from the amplifier circuit based on a data signal received by the amplifier circuit at the first input connection; and
    wherein the error correction circuit comprises:
        a voltage controlled current source to provide an error correction current at the second output connection to cancel the distortion introduced into the output signal from the amplifier circuit, the error correction current being related to the error signal propagated by the second input connection; and
        a feedback circuit for the voltage controlled current source, wherein the feedback circuit is configured to provide an impedance for the voltage controlled current source that is sufficiently high such that the error correction current is independent of voltage fluctuations in the data signal.

2. The driver circuit of claim 1, wherein the voltage controlled current source comprises a first operational amplifier connected in series with a second operational amplifier, the first operational amplifier connected to the second input connection and the second operational amplifier connected to the second output connection.

3. The driver circuit of claim 2, wherein the feedback circuit is connected between a first input of the second operational amplifier and the second output connection, the feedback circuit is configured to provide a feedback signal to the first input of the second operational amplifier based on a load voltage at the second output connection.

4. The driver circuit of claim 1, wherein the amplifier circuit comprises an operational amplifier and an additional feedback circuit, the operational amplifier having an input connected to the first input connection, the additional feedback circuit connected between an output of the operational amplifier and the input of the operational amplifier, the second input connection being connected to the additional feedback circuit and the input of the operational amplifier to receive the error signal.

5. The driver circuit of claim 4, wherein the input of the operational amplifier is an inverting input of the operational amplifier and the operational amplifier has a non-inverting input connected to ground.

6. The driver circuit of claim 1, wherein the voltage controlled current source comprises an operational amplifier, and wherein the feedback circuit comprises a voltage divider coupled between an input of the operational amplifier and an output of the operational amplifier.

7. A driver circuit for a communication device comprising:
an amplifier circuit comprising a first input connection and a first output connection;
an error correction circuit connected in parallel to the amplifier circuit, the error correction circuit having a second input connection connected to the amplifier circuit to propagate an error signal from the amplifier circuit and a second output connection connected to the first output connection of the amplifier circuit; and
the error correction circuit comprising:
a voltage controlled current source to provide an error correction current at the second output connection to cancel distortion introduced to a data signal received by the amplifier circuit, the error correction current being related to the error signal propagated by the second input connection, the voltage controlled current source comprising a first operational amplifier connected in series with a second operational amplifier, the first operational amplifier connected to the second input connection and the second operational amplifier connected to the second output connection; and
a feedback circuit connected between a first input of the second operational amplifier and the second output connection, the feedback circuit is configured to provide a feedback signal to the first input of the second operational amplifier based on a load voltage at the second output connection, wherein the feedback circuit comprises a voltage divider configured to provide the feedback signal to the input of the second operational amplifier, the feedback signal corresponding to about ½ of the load voltage.

8. The driver circuit of claim 7, wherein a second input of the second operational amplifier is connected to a gain circuit, the gain circuit configured to provide an input gain of 2 to the second input of the second operational amplifier such that an output voltage of the second operational amplifier is equal to the load voltage.

9. The driver circuit of claim 8, wherein an output of the first operational amplifier is connected to the gain circuit.

10. The driver circuit of claim 8, wherein the first input of the second operational amplifier is a non-inverting input and the second input of the second operational amplifier is an inverting input.

11. A method for error correction in a driver circuit of a transceiver, the driver circuit having an input connection and an output connection, the method comprising:
receiving a data signal at the input connection;
amplifying the data signal with an amplifier connected to the input connection;
providing an error signal based on an output of the amplifier, the error signal corresponding to an error voltage associated with an amount of distortion in the output from the amplifier based on the data signal received by the amplifier at the input connection;
propagating the error signal to an error correction circuit, wherein the error correction circuit comprises a voltage controlled current source and a feedback circuit;
generating an error correction current with the voltage controlled current source of the error correction circuit in response to the error signal, wherein the feedback circuit is configured to provide an impedance for the voltage controlled current source that is sufficiently high such that the error correction current is independent of voltage fluctuations in the data signal; and
providing the error correction current to the output connection to cancel the error voltage associated with the distortion in the output of the amplifier.

12. The method of claim 11, wherein:
the voltage controlled current source comprises an operational amplifier;
the feedback circuit is connected between a non-inverting input of the operational amplifier and the output connection; and
the generating the error correction current comprises configuring the feedback circuit such that the output voltage of the operational amplifier is substantially equal to a load voltage at the output connection.

13. A communication device comprising:
a transceiver coupled to an input connection to receive a data signal, the transceiver coupled to an output connection to transmit an amplified output signal on the output connection, the transceiver comprising a driver circuit configured to receive the data signal and generate the amplified output signal;
the driver circuit comprising:
an amplifier circuit coupled to the input connection and the output connection, the amplifier circuit configured to amplify the data signal received at the input connection and provide the amplified output signal; and
a feed-forward error correction circuit having:
a voltage controlled current source coupled to the amplifier circuit, the voltage controlled current source configured to source current for an error correction signal based on an error voltage associated with an amount of distortion in an output from the amplifier circuit based on the data signal received by the amplifier circuit at the input connection and to transmit the error correction signal to the output connection such that the error correction signal is combined with the amplified output signal thereby cancelling from the amplified output signal distortion introduced by the amplifier circuit; and
a feedback circuit for the voltage controlled current source, wherein the feedback circuit is configured to provide an impedance for the voltage controlled current source that is sufficiently high such that the error correction signal is independent of voltage fluctuations in the data signal.

14. The communication device of claim 13, wherein the voltage controlled current source comprises a first operational amplifier connected in series with a second operational amplifier, the first operational amplifier connected to the input connection and the second operational amplifier connected to the output connection.

15. The communication device of claim 14, wherein the feedback circuit is connected between a first input of the second operational amplifier and the output connection, the feedback circuit configured to provide a feedback signal to the first input of the second operational amplifier based on a load voltage at the output connection.

16. The communication device of claim 13, wherein the amplifier circuit comprises an operational amplifier and an additional feedback circuit, the operational amplifier having an input connected to the input connection and the additional feedback circuit, the additional feedback circuit being connected to an output of the operational amplifier.

17. The communication device of claim 13, wherein:
the feed-forward error correction circuit connected in parallel to the amplifier circuit; and
the amplifier circuit comprises an output resistor connected in series with the output connection, the error correction signal from the feed-forward error correction circuit passes through the output resistor to form an opposite voltage to cancel the distortion in the amplified output signal introduced by the amplifier circuit.

18. A communication device comprising:
a transceiver coupled to an input connection to receive a data signal, the transceiver coupled to an output connection to transmit an amplified output signal on the output connection, the transceiver comprising a driver circuit configured to receive the data signal and generate the amplified output signal;
the driver circuit comprising:
an amplifier circuit coupled to the input connection and the output connection, the amplifier circuit configured to amplify the data signal received at the input connection and provide the amplified output signal to the output connection; and
a feed-forward error correction circuit comprising:
a voltage controlled current source coupled to the amplifier circuit, the voltage controlled current source configured to source current for an error correction signal based on a voltage of the data signal and to transmit the error correction signal to the output connection such that the error correction signal is combined with the amplified output signal thereby cancelling from the amplified output signal distortion introduced by the amplifier circuit, the voltage controlled current source comprises a first operational amplifier connected in series with a second operational amplifier, the first operational amplifier connected to the input connection and the second operational amplifier connected to the output connection; and
a feedback circuit connected between a first input of the second operational amplifier and the output connection, the feedback circuit configured to provide a feedback signal to the first input of the second operational amplifier based on a load voltage at the output connection, wherein the feedback circuit comprises a voltage divider configured to provide the feedback signal to the input of the second operational amplifier, the feedback signal corresponding to about half of the load voltage.

19. The communication device of claim 18, wherein a second input of the second operational amplifier is connected to a gain circuit, the gain circuit configured to provide an input gain at the second input of the second operational amplifier such that an output voltage of the second operational amplifier is equal to the load voltage.

20. The communication device of claim 19, wherein an output of the first operational amplifier is connected to the second input of the second operational amplifier.

* * * * *